(12) United States Patent
Scharf et al.

(10) Patent No.: US 10,629,575 B1
(45) Date of Patent: Apr. 21, 2020

(54) STACKED DIE SEMICONDUCTOR PACKAGE WITH ELECTRICAL INTERPOSER

(71) Applicant: Infineon Technologies AG, Neubiberg (DE)

(72) Inventors: Thorsten Scharf, Regensburg (DE); Carsten Ahrens, Regensburg (DE); Helmut Brech, Lappersdorf (DE); Martin Gruber, Schwandorf (DE); Thorsten Meyer, Regensburg (DE); Matthias Zigldrum, Regensburg (DE)

(73) Assignee: Infineon Techologies AG, Neubiberg (DE)

( * ) Notice: Subject to any disclaimer, the term of this patent is extended or adjusted under 35 U.S.C. 154(b) by 0 days.

(21) Appl. No.: 16/219,277

(22) Filed: Dec. 13, 2018

(51) Int. Cl.
| | |
|---|---|
| *H01L 23/02* | (2006.01) |
| *H01L 25/16* | (2006.01) |
| *H01L 23/00* | (2006.01) |
| *H01L 21/56* | (2006.01) |
| *H01L 23/31* | (2006.01) |
| *H01L 23/538* | (2006.01) |

(52) U.S. Cl.
CPC .......... *H01L 25/16* (2013.01); *H01L 21/561* (2013.01); *H01L 21/565* (2013.01); *H01L 21/568* (2013.01); *H01L 23/3114* (2013.01); *H01L 23/5384* (2013.01); *H01L 24/09* (2013.01); *H01L 24/17* (2013.01); *H01L 24/73* (2013.01); *H01L 24/97* (2013.01); *H01L 2924/13064* (2013.01); *H01L 2924/1433* (2013.01)

(58) Field of Classification Search
CPC ............ H01L 25/0657; H01L 2224/97; H01L 2921/181; H01L 2224/32145; H01L 224/16145; H01L 24/07; H01L 2924/18161; H01L 2224/08145; H01L 2225/06562
USPC ........ 257/686, 777, 778; 438/107, 108, 109, 438/110
See application file for complete search history.

(56) References Cited

U.S. PATENT DOCUMENTS

| | | | | |
|---|---|---|---|---|
| 2009/0152704 | A1* | 6/2009 | Cablao | ............... H01L 25/0652 |
| | | | | 257/686 |
| 2010/0314740 | A1* | 12/2010 | Choi | .................. H01L 23/3121 |
| | | | | 257/686 |
| 2011/0018115 | A1* | 1/2011 | Takahashi | ............. H01L 21/561 |
| | | | | 257/686 |

(Continued)

*Primary Examiner* — S. V. Clark
(74) *Attorney, Agent, or Firm* — Murphy, Bilak & Homiller, PLLC

(57) ABSTRACT

A semiconductor chip assembly includes first and second semiconductor dies that each include opposite facing upper and lower sides and an outer edge side, and an electrical interposer having opposite facing first and second conductive surfaces and a conductive connection between the conductive surfaces. The second semiconductor die is mounted on top of the first semiconductor die and the interposer such that the lower side of the second semiconductor die faces the first semiconductor die and the interposer, a first lateral section of the second semiconductor die at least partially covers the upper side of the first semiconductor die, and a second lateral section of the second semiconductor die extends past the outer edge side of the first semiconductor die. The first conductive surface is electrically connected to a first terminal that is disposed on a lower side of the second semiconductor die.

20 Claims, 8 Drawing Sheets

(56) References Cited

U.S. PATENT DOCUMENTS

| | | | |
|---|---|---|---|
| 2011/0241194 A1* | 10/2011 | Chen | H01L 25/03 |
| | | | 257/686 |
| 2011/0285005 A1* | 11/2011 | Lin | H01L 21/4846 |
| | | | 257/686 |
| 2014/0312481 A1* | 10/2014 | Choi | H01L 25/50 |
| | | | 257/686 |
| 2016/0190107 A1* | 6/2016 | Meyer | H01L 23/31 |
| | | | 257/686 |

* cited by examiner

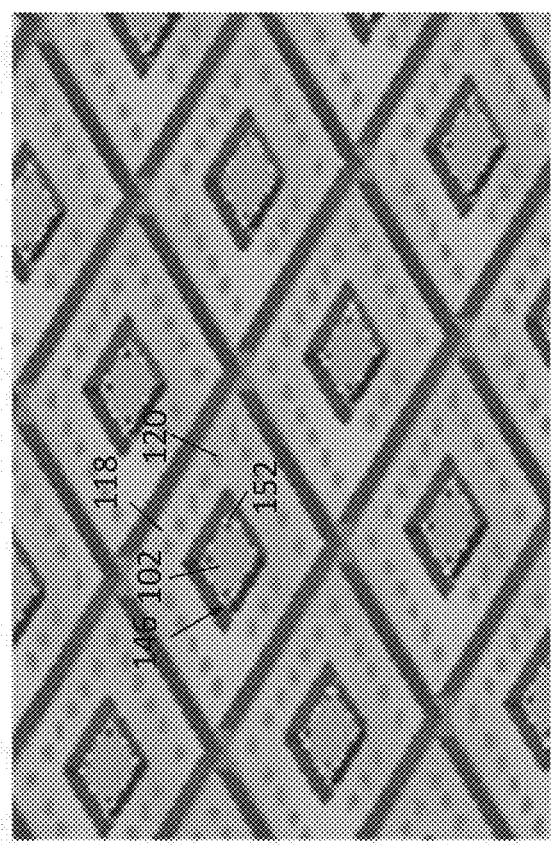
FIG. 2B
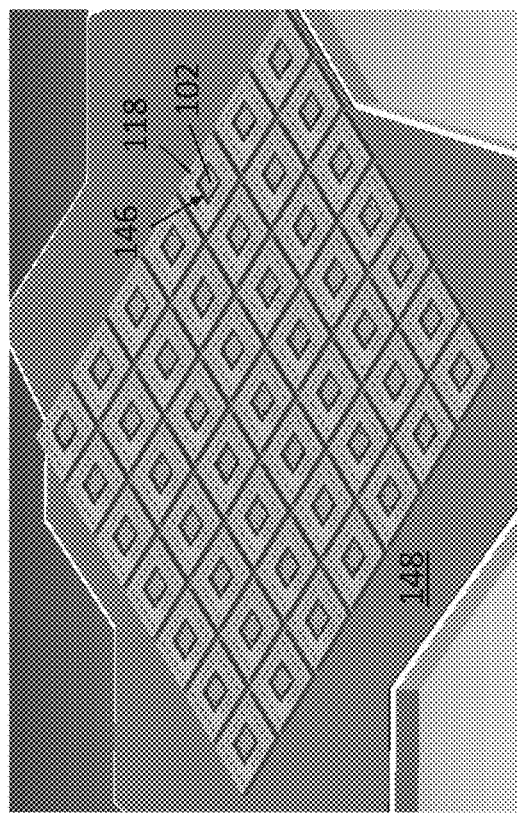
FIG. 2A
FIGURE 2

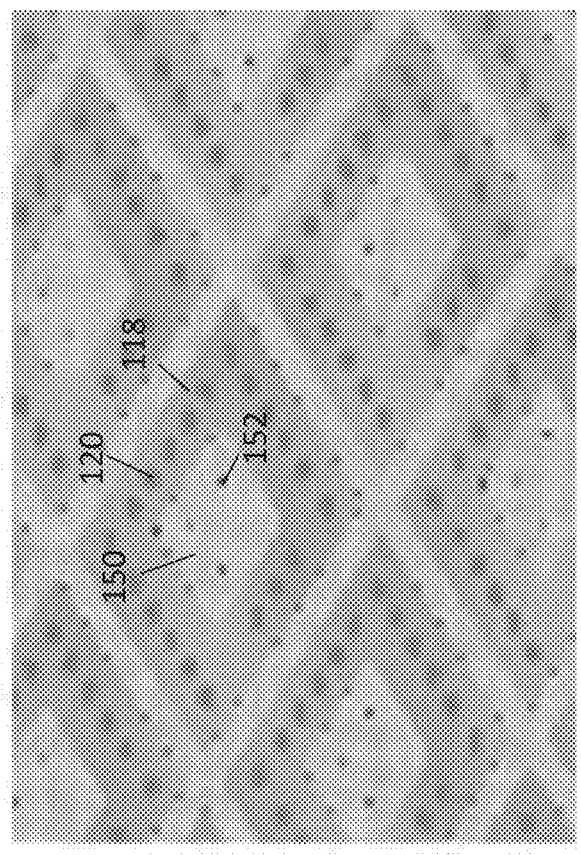
FIG. 3B
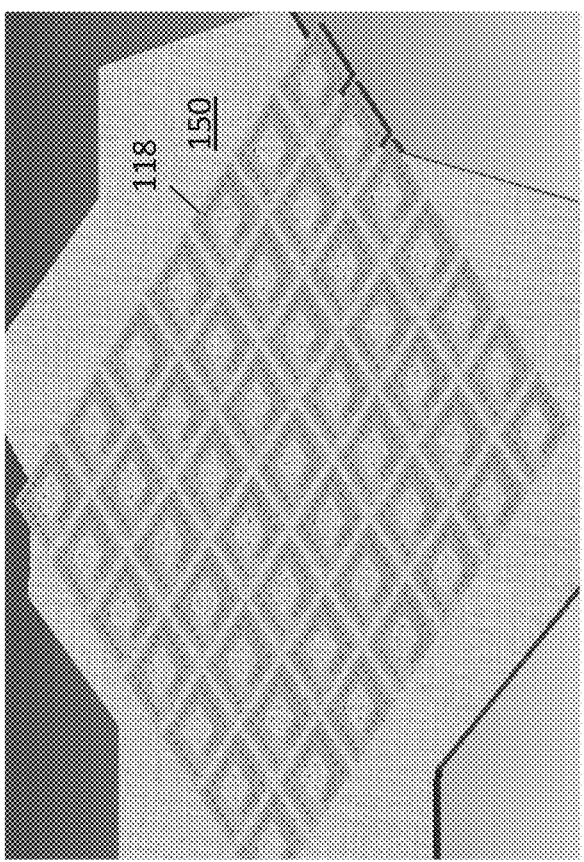
FIG. 3A
FIGURE 3

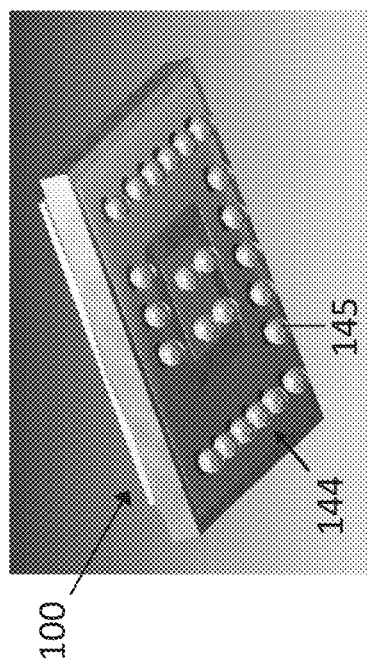
FIG. 4B
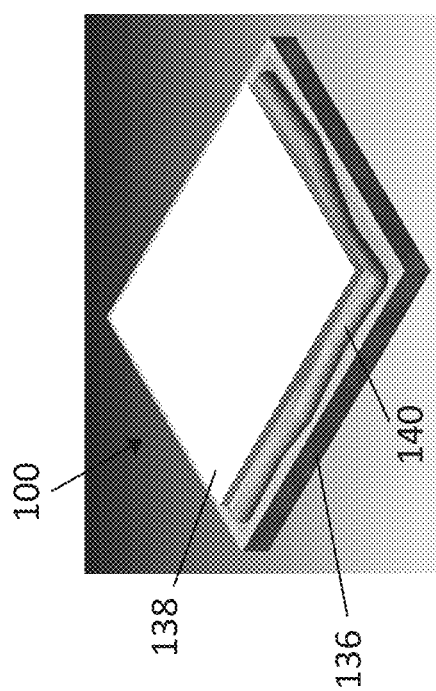
FIG. 4C
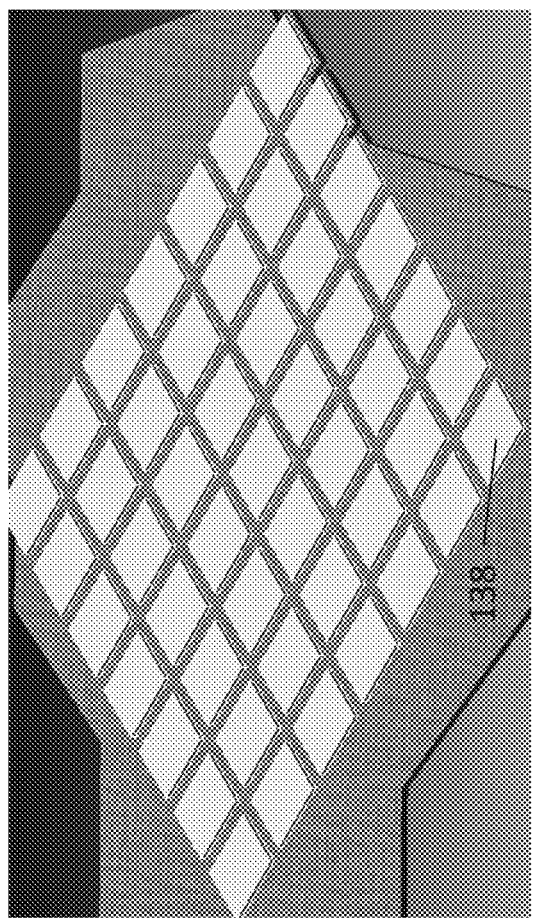
FIG. 4A
FIGURE 4

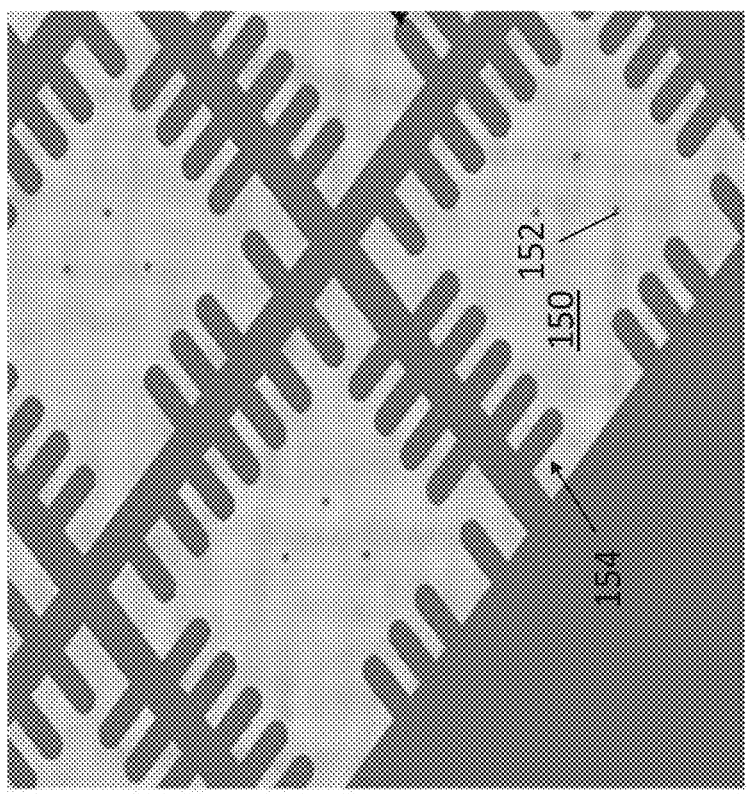
FIG. 7B
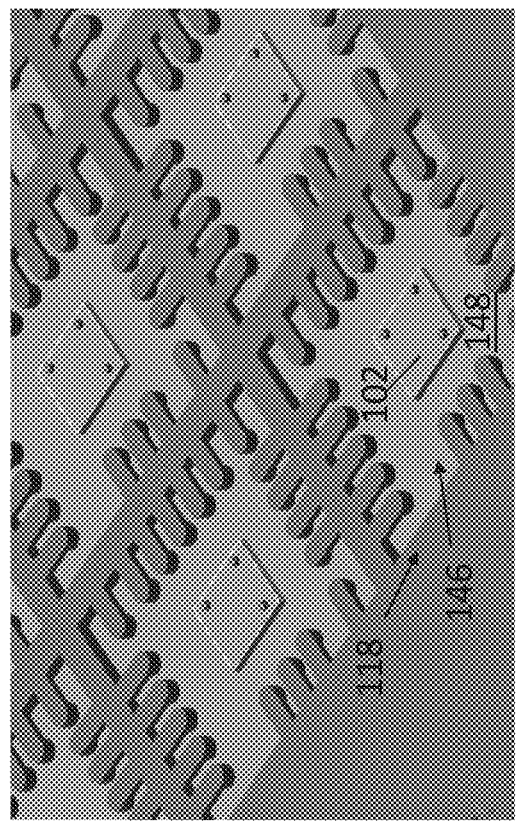
FIG. 7A
FIGURE 7

STACKED DIE SEMICONDUCTOR PACKAGE WITH ELECTRICAL INTERPOSER

FIELD OF TECHNOLOGY

The present application relates to semiconductor device packaging, and particularly relates to stacked die semiconductor packages.

BACKGROUND

Area consumption is an important design consideration in many semiconductor applications. In applications such as mobile phones and RF applications, reducing the necessary circuit board footprint for the electronic subcomponents (e.g., amplifiers, processors, receivers, etc.) is highly desired. For this reason, some package designs employ stacking techniques wherein multiple semiconductor dies (chips) or multiple semiconductor packages are stacked on top of one another. In the case of chip-on-chip stacking technology, two semiconductor dies are attached to one another in a stacked arrangement with bond wire connections to the dies. The stacked chip arrangement with wire bond connections is then molded to form the final package.

In some applications it is desirable to stack two different size chips on top of one other. Conventionally, the smaller chip is stacked on top of the larger chip. This configuration allows for the terminals of the larger chip to be electrically accessible at the peripheral uncovered region of the chip. However, this chip arrangement is not well suited for applications in which the smaller chip generates more heat during operation than the larger chip. In that case, it is preferable to place the smaller chip at the bottom of the package so that it can come into close or direct contact with an external heat sink.

To date, packaging solutions for stacking a larger chip on top of a smaller chip have various drawbacks. Conventional designs employ relatively long and complex bond wire connections which have high parasitic values and/or utilize intermediate redistribution layers which add cost and complexity to the design.

SUMMARY

A semiconductor chip assembly is disclosed. According to an embodiment, the semiconductor chip assembly includes first and second semiconductor dies. The first and second semiconductor dies each include opposite facing upper and lower sides and an outer edge side extending between the respective upper and lower sides of the first and second semiconductor dies. The semiconductor chip assembly further includes an electrical interposer having a first conductive surface disposed at a first end, a second conductive surface disposed at a second end that is opposite from the first end, and a conductive connection between the first and second conductive surfaces. The second semiconductor die is mounted on top of the first semiconductor die and the interposer such that: the lower side of the second semiconductor die faces the upper side of the first semiconductor die and the first end of the interposer, a first lateral section of the second semiconductor die at least partially covers the upper side of the first semiconductor die, and a second lateral section of the second semiconductor die extends past the outer edge side of the first semiconductor die and over the first end of the interposer. The first conductive surface is electrically connected to a first terminal of the second semiconductor die that is disposed on the lower side of the second semiconductor die.

According to another embodiment, the semiconductor chip assembly includes an amplifier die having opposite facing upper and lower sides, and an input terminal disposed on the upper side of the amplifier die. The semiconductor chip assembly additionally includes a controller die having opposite facing upper and lower sides, an input terminal and an output terminal disposed on the lower side of the controller die. The semiconductor chip assembly additionally includes an electrical interposer having a first conductive surface disposed at a first end, a second conductive surface disposed at a second end that is opposite from the first end, and a conductive connection between the first and second conductive surfaces. The semiconductor chip assembly additionally includes a planar connection interface disposed at or below the lower side of the first semiconductor die, the planar connection interface having a plurality of conductive I/O terminals. The controller die is mounted on top of the amplifier die such that a first lateral portion of the controller die having the output terminal of the controller die is aligned with and electrically connected to the input terminal of the amplifier die, and a second lateral portion of the controller die having the input terminal of the controller die is aligned with and electrically connected to the first conductive surface of the interposer. The electrical interposer provides an electrical connection between a first one of the I/O terminals and the input terminal of the controller die.

A method of providing a semiconductor chip assembly is disclosed. According to an embodiment, the method includes providing first and second semiconductor dies, the first and second semiconductor dies each having opposite facing upper and lower sides and an outer edge side extending between the respective upper and lower sides of the first and second semiconductor dies. The method further includes providing an electrical interposer having a first conductive surface disposed at a first end, a second conductive surface disposed at a second end that is opposite from the first end, and a conductive connection between the first and second conductive surfaces. The method further includes mounting the second semiconductor die on top of the first semiconductor die and the interposer such that: the lower side of the second semiconductor die faces the upper side of the first semiconductor die and the first end of the interposer, a first lateral section of the second semiconductor die at least partially covers the upper side of the first semiconductor die, and a second lateral section of the second semiconductor die extends past the outer edge side of the first semiconductor die and over the first end of the interposer. The method further includes electrically connecting the first conductive surface to a first conductive terminal that is disposed on the lower side of the second semiconductor die.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIGS. 2A and 2B, depicts a method of producing a semiconductor chip assembly, according to an embodiment. FIG. 2A depicts an isometric view of a batch of interposers and smaller dies placed on a temporary carrier, and FIG. 2B is a magnified view from a region of FIG. 2A.

FIG. 3, which includes FIGS. 3A and 3B, depicts the assembly of FIG. 2 after a first molding process which encapsulates the smaller dies and the interposer. FIG. 3A depicts an isometric view of the assembly, and FIG. 3B is a magnified view from a region of FIG. 3A.

FIG. 4, which includes FIGS. 4A, 4B, and 4C, depicts the assembly of FIG. 3 after a second molding process which encapsulates the larger dies. FIG. 4A depicts an isometric view of the batch assembly, FIG. 4B depicts an isometric view of a top side of a singulated chip assembly, and FIG. 4B depicts an isometric view of a bottom side of a singulated chip assembly.

FIGS. 5A, and 5B, depicts an alternate embodiment of an electrical interposer that can be used according to the method of FIGS. 2-4. FIG. 5A depicts placement of the electrical interposer and a first semiconductor die on a temporary carrier. FIG. 5B depicts the device after molding and connection to a second semiconductor die.

FIG. 7, which includes FIGS. 7A and 7B, depicts a method of forming a semiconductor die assembly using the electrical interposer of FIG. 6, according to an embodiment. FIG. 7A depicts an isometric view of a batch of interposers and smaller dies placed on a temporary carrier, and FIG. 7B depicts the batch assembly of FIG. 7A after a first mold process.

DETAILED DESCRIPTION

According to embodiments described herein, a semiconductor chip assembly includes a second semiconductor die stacked on top of a first semiconductor die such that the second (upper) semiconductor die laterally overhangs past an outer edge side of the first (lower) semiconductor die. The assembly additionally includes an electrical interposer that is provided next to the lower die and underneath the overhanging portion of the upper die. The electrical interposer provides a direct, low resistance electrical connection between a terminal on the lower side of the second (upper) semiconductor die and an I/O terminal that is externally accessible at the bottom side of the assembly. The interposer advantageously provides a low-cost solution for packaging a larger device on top of a smaller device, with the terminals of the larger device being electrically accessible by low resistance connections.

Figure 1:
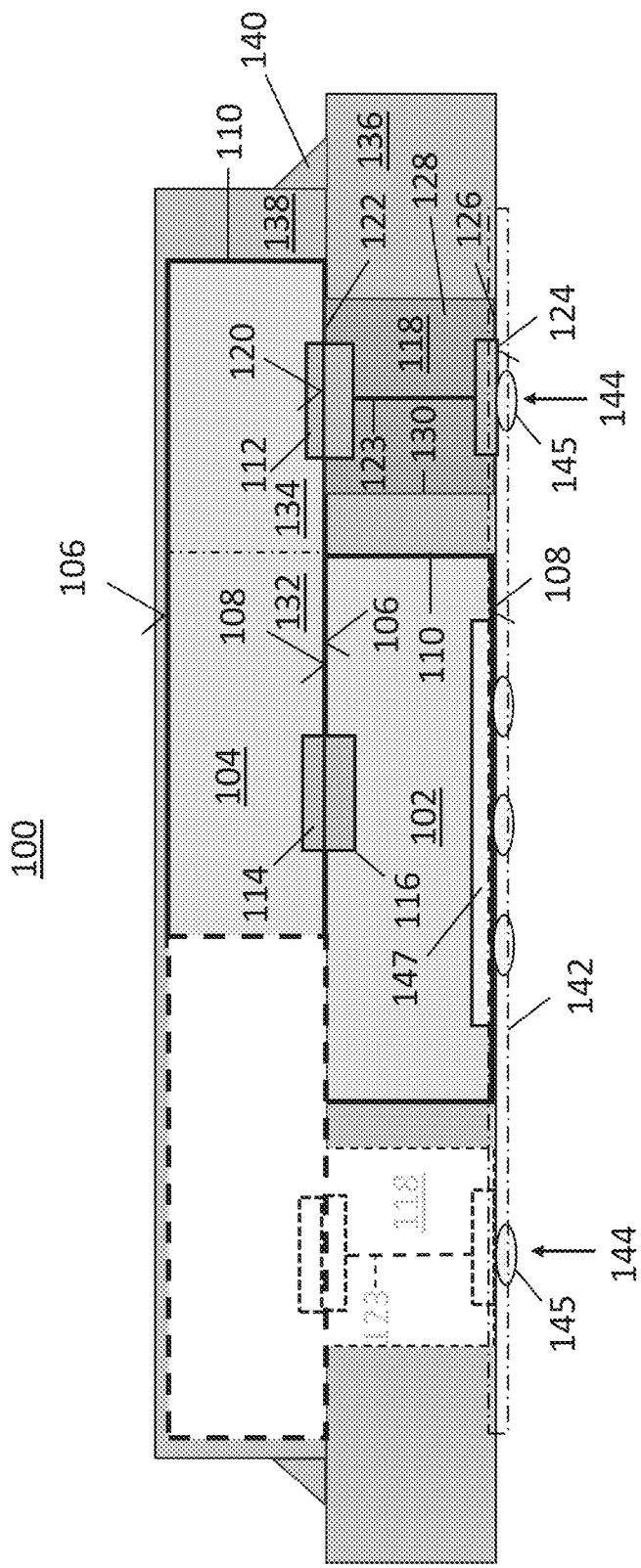
FIG. 1 depicts a semiconductor chip assembly with a larger die stacked on top of a smaller die and an electrical interposer providing an externally accessible electrical connection to the larger die, according to an embodiment.

Referring to FIG. 1, a semiconductor chip assembly 100 includes first and second semiconductor dies 102, 104. Each of the first and second semiconductor dies 102, 104 includes opposite facing upper and lower sides 106, 108 and an outer edge side 110 extending between the respective opposite facing upper and lower sides 106, 108 of the first and second semiconductor dies 102, 104. The upper side 106, the lower side 108, and the outer edge side 110 are outermost surfaces of the semiconductor material of the first and second semiconductor dies 102, 104.

The first and second semiconductor dies 102, 104 each include terminals which provide input/output/power connections (e.g., gate, source, etc.) to the integrated circuitry of the first and second semiconductor dies 102, 104. These terminals can be provided by electrically conductive bond pads. In some embodiments, these bond pads are coplanar with the semiconductor surfaces to which they are disposed on, i.e., the upper and lower sides 106, 108. Alternatively, these bond pads can extend past the semiconductor material of the die, e.g., as a pillar structure, solder bump, under-bump-metallization, etc. In the depicted embodiment, the lower side 108 of the second semiconductor die 104 includes first and second terminals 112, 114, and the upper side 106 of the first semiconductor die 102 includes a third terminal 116. As shown, the third terminal 116 extends past the upper side 106 of the first semiconductor die 102, and the first and second terminals 112, 114 are coplanar with the lower side 108 of the second semiconductor die 104.

The semiconductor chip assembly 100 additionally includes an electrical interposer 118. The electrical interposer 118 includes a first planar conductive surface 120 disposed at a first end 122, and a second planar conductive surface 124 disposed at a second end 126 that is opposite from (i.e., faces away from) the first end 122. The first and second planar conductive surfaces 120, 124 are electrically connected to one another by a conductive connection 123 that is provided within the electrical interposer 118.

The electrical interposer 118 is structurally configured to provide an electrical connection interface that allows the second semiconductor die 104 to be rested on and electrically connected to the electrical interposer 118 in a surface mount fashion. According to an embodiment, the first planar conductive surface 120 and a planar upper surface of the third terminal 116 are substantially coplanar with one another. In this way, the first planar conductive surface 120 and the third terminal 116 provide separate terminals that directly interface with the lower side 108 of the second semiconductor die 104 in a surface mount configuration. As shown, first planar conductive surface 120 is coplanar with the first end 122 of the electrical interposer 128. In other embodiments, the first planar conductive surface 120 can protrude away from the first end 122.

In an embodiment, the electrical interposer 118 is configured as a standalone element. That is, the electrical interposer 118 can be physically rested on a planar surface (e.g., a carrier) without any mechanism holding it in place. To this end, the second end 126 of the electrical interposer 118 is sufficiently planar to stabilize the electrical interposer 118 and the electrical interposer 118 has sufficient structural integrity (e.g., mechanical rigidity) to allow the electrical interposer 128 to rest on a planar surface independently.

In an embodiment, the thickness of the electrical interposer 118 is correlated to the thickness of the first semiconductor die 102. For example, the electrical interposer 118 can have a thickness as measured between the first and second ends 122, 126 that is substantially equal to (e.g., within +/−5%) of a thickness of the first semiconductor die 102 as measured between its upper and lower sides 106, 108. In this way, the electrical interposer 118 and the first semiconductor die 102 can be rested on a planar surface next to one another and provide a substantially planar for the first semiconductor die 102 to be mounted on.

Generally speaking, the electrical interposer 118 can include a wide variety of electrically conductive materials, e.g., aluminum, copper, alloys thereof, etc. According to an embodiment, the electrical interposer 118 has an insulative body 128 that is formed from electrically insulating materials such as plastics (e.g., epoxy, mold compound, etc.), fiberglass materials (e.g., FR-2, FR-4, FR-6, CEM-1, spheric glass fibers), etc. In this configuration, the insulative body 128 includes insulating sidewalls 130 that extend between the first and second ends 122, 126 of the electrical interposer 118; the first and second planar conductive surfaces 120, 124 are provided by bond pads disposed on top and below the insulative body 128; and the conductive connection 123 between the first and second conductive surfaces 120, 124 is provided by an electrical conductor that is contained within the rigid insulative body 128. Alternatively, the electrical interposer 118 can be provided from an exclusively conductive structure, wherein the first and second planar conductive surfaces 120, 124 represent outer surfaces of the structure. Various examples of each configuration will be described in further detail below.

The second semiconductor die 104 is mounted on top of the first semiconductor die 102 and the electrical interposer 118 such that the lower side 108 of the second semiconductor die 104 faces the upper side 106 of the first semiconductor die 102 and the first end 122 of the electrical interposer 118. In one embodiment, the lower side 108 of the second semiconductor die 104 directly contacts the first semiconductor die 102 and the first end 122 of the electrical interposer 118. Alternatively, these surfaces can be separated from one another by, e.g., conductive structures and/or mold material. Additionally, the second semiconductor die 104 is mounted so that a first lateral section 132 of the second semiconductor die 104 at least partially covers the upper side 106 of the first semiconductor die 102. In other words, the first lateral section 132 of the second semiconductor die 104 directly overlaps with at least a portion of the first semiconductor die 102, and the lower side 108 of the second semiconductor die 104 is physically inaccessible in the first lateral section 132. Additionally, the second semiconductor die 104 is mounted so that a second lateral section 134 of the second semiconductor die 104 extends past the outer edge side 110 of the first semiconductor die 102 and over the first end 122 of the electrical interposer 118. In other words, the second lateral section 134 of the second semiconductor die 104 does not directly overlap with the first semiconductor die 102 such that the lower side 108 of the second semiconductor die 104 is physically accessible in the second lateral section 134.

The second semiconductor die 104 is mounted so that the second terminal 114 of the second semiconductor die 104 is aligned with and electrically connected to the third terminal 116 of the first semiconductor die 102. Additionally, the second semiconductor die 104 is mounted so that the first terminal 112 of the second semiconductor die 104 is aligned with and electrically connected to the first planar conductive surface 120 of the electrical interposer 118. In this context, "aligned with" means that at least part of the respective conductive surfaces directly overlap with one another so that a direct electrical connection is possible. The electrical connection can be effectuated by direct surface to surface contact and/or using a conductive intermediary, e.g., solder, sinter, conductive glue, etc.

The semiconductor chip assembly 100 additionally includes electrically insulating mold compound that encapsulates the first and second semiconductor dies 102, 104 and the electrical interposer 118. The mold compound can include a wide variety of electrically insulating materials such as ceramics, epoxy materials and thermosetting plastics, to name a few. In the depicted embodiment, the first semiconductor die 102 and the electrical interposer 118 are encapsulated by a first mold body 136 and the second semiconductor die 104 is encapsulated by a second mold body 138 which is formed separately from the first mold body 136. Optionally, an underfill 140 may be provided at the corner interface between the first and second mold bodies 136, 138 to seal and protect the electrical connections between the first and second semiconductor dies 102, 104 and the electrical interposer 118.

The semiconductor chip assembly 100 includes a planar connection interface 142. The planar connection interface 142 is a generally planar surface of the semiconductor chip assembly 100 that is disposed at or below the lower side 108 of the first semiconductor die 102. The planar connection interface 142 includes a number of I/O terminals 144 which provide electrical connectivity to the various terminals of the first and second semiconductor dies 102, 104. The planar connection interface 142 is configured so that semiconductor chip assembly 100 can be mounted on an external apparatus, such as a printed circuit board, with the I/O terminals 144 directly contacting and electrically connected to corresponding terminals in the external apparatus. Optionally, electrically conductive solder balls 145 or conductive bumps, etc., may be provided on the I/O terminals 144 for ease of solderability.

According to an embodiment, the second end 126 of the electrical interposer 118 provides at least part of the planar connection interface 142. For instance, the second planar conductive surface 124 of the electrical interposer 118 can be substantially coplanar with the lower side 108 of the first semiconductor die 102 and exposed from the first mold body 136 so that it is electrically accessible at the bottom of the semiconductor chip assembly 100. In this configuration, the second planar conductive surface 124 directly provides an I/O terminal 144 that can be electrically connected to an external apparatus. Alternatively, further conductive structures (e.g., via structure) can be provided between the second planar conductive surface 124 and one of the I/O terminals 144.

Generally speaking, the first and second semiconductor dies 102, 104 can have a variety of different device configurations. Examples of these device configurations include MOSFET (metal-oxide semiconductor field-effect transistor) devices, LDMOS (laterally-diffused metal-oxide semiconductor) devices, HEMT (high electron mobility transistor) devices, diodes, thyristors, controllers, amplifiers and processors, to name a few. One or both of the first and second semiconductor dies 102, 104 can be configured as vertical devices, i.e., devices which conduct in a direction perpendicular to the respective upper and lower sides 106, 108, or alternatively as lateral devices, i.e., devices which conduct in a direction parallel to the respective upper and lower sides 106, 108. The second semiconductor die may include an exposed conductor 147 (e.g., metal). In various embodiments including lateral configurations, the exposed conductor 147 is electrically inactive and serves as a thermal dissipation mechanism. Alternatively, in embodiments including vertical configurations, the exposed conductor 147 is configured as a terminal of the first semiconductor die 102 (e.g., a source or drain terminal) and thus provides one of the I/O terminals 144.

According to an embodiment, the semiconductor chip assembly 100 is configured as a combined amplifier/controller. In this configuration, the first semiconductor die 102 is an amplifier die and the second semiconductor die 104 is a driver/controller die. More particularly, the first semiconductor die 102 can be configured as a GaN (Gallium Arsenide) based HEMT (high electron mobility transistor) device, and the controller die can be configured as a silicon-based ASIC (application specific integrated circuit). In this configuration, the controller die is configured to provide a signal to be amplified to the amplifier die, and to operate the amplifier die, e.g., ON/OFF control, magnitude, etc. The amplifier die receives the signal to be amplified at an input terminal and provides an amplified version of the signal at an output terminal. In one example, the first terminal 112 is an input terminal of the controller die, the second terminal 114 is an output terminal of the controller die, and the third terminal 116 is an input terminal of the amplifier die. An unamplified version of the RF signal externally is provided to the input terminal of the controller die via the electrical interposer 118, which in turn is provided to the amplifier die via the conductive connection between the second and third terminals 114, 116. The amplified version of the RF signal can be returned to one of the I/O terminals 144 by similar conductive terminal connections (not shown) and further interposers 118. The same concept can be used to transmit power or reference potential voltages between the two dies.

According to an embodiment, the second semiconductor die 104 is larger than the first semiconductor die 102. That is, a lateral area of the second semiconductor die 104 as defined by a perimeter of the outer edge side 110 of the second semiconductor die 104 is greater than a lateral area of the first semiconductor die 102 as defined by a perimeter of the outer edge side 110 of the first semiconductor die 102. FIG. 1 shows a dashed region of the second semiconductor die 104 which corresponds to this embodiment. In this case, the second semiconductor die 104 laterally overhangs past the outer edge side 110 of the first semiconductor die 102 in all directions. The second semiconductor die 104 may include further terminals in these laterally overhanging portions which are connected to the I/O terminals 144 by an interposer in a similar manner as previously depicted. The figure additionally includes an additional electrical interposer 118 in dashed lines which includes corresponding first and second planar conductive surfaces 120, 124 and provides another electrical connection to one of the I/O terminals 144. This electrical interposer 118 can be a discrete structure that is distinct from the electrical interposer 118 connected to the first terminal 112. Alternatively, the electrical interposer 118 can be a continuous structure which forms an enclosed loop around the first semiconductor die 102 and includes multiple isolated conductive connections 123. Moreover, in addition to or instead of providing the vertical electrical connections as described herein, the electrical interposer 118 can be configured with horizontal routing to provide electrical connectivity between laterally separated terminals.

In one example, the semiconductor chip assembly 100 can be mounted directly on a substrate, e.g., a PCB, with the stacked arrangement providing a space saving multi-chip configuration. The substrate may include a number of other devices, e.g., switches, power converters, filter, logic circuitry, and passive components, such capacitors, resistors, inductors, etc. These components can be connected to the substrate, e.g., by solder, sinter, wire bonding, etc.

Referring to FIG. 2, a technique for forming the semiconductor chip assembly 100 as described with reference to FIG. 1 is depicted, according to an embodiment. According to this technique, multiple ones of the semiconductor chip assembly 100 are formed simultaneously. This technique can be performed using standard sized package processing panels, e.g., 24"×18" panels, 70 mm×25 mm panels, 300 mm² round panels, etc.

In the embodiment of FIG. 2, the electrical interposer 118 forms an enclosed loop around a central opening 146. That is, the electrical interposer 118 continuously extends around a three-dimensional volume, which forms the central opening 146. In the depicted embodiment, the enclosed loop has the shape of a rectangle. More generally, the enclosed loop can have any of a variety of enclosed geometries, e.g., circle, polygon, etc.

In the embodiment of FIG. 2, the electrical interposer 118 is provided by a printed circuit board substrate. In this example, the electrical interposer 118 includes alternating layers of metallization (e.g., copper) and insulator (e.g., pre-impregnated composite fiber such as FR-4). The first and second planar conductive surfaces 120, 124 are provided by conductive bond pads disposed at opposite ends of the PCB substrate. The conductive connection 123 can be provided by a through via which extends through the various layers of the PCB substrate.

According to this technique, a temporary carrier 148 is provided. Generally speaking, the temporary carrier 148 can be any planar surface that is suitable for handling, and transfer of electronic components through various semiconductor processing tools. In one example, the temporary carrier 148 includes a thermal release tape.

The electrical interposer 118 is placed on the temporary carrier 148 such that the second end 126 of the electrical interposer 118 faces and rests upon the temporary carrier 148. In addition, the first semiconductor die 102 is placed on the temporary carrier 148 with the lower side 108 of the first semiconductor die 102 resting on the temporary carrier 148. The first semiconductor die 102 is placed in the central opening 146 of the electrical interposer 118. In the depicted embodiment, an area of the central opening 146 is larger than an area of the first semiconductor die 102. As a result, the outer edge side 110 of the first semiconductor die 102 is spaced apart from the interior sidewalls 130 of the electrical interposer 118 in all directions.

Referring to FIG. 3, a first molding process is performed. According to this technique, an electrically insulating mold material 150 is formed on and around the first semiconductor die 102 and the electrical interposer 118. This can be done using known molding techniques, such as injection molding, transfer molding, compression molding, etc. The mold material 150 fills the region between the first semiconductor die 102 and the sidewalls 130 of interposer. In addition, some of the mold material 150 may cover the upper side 106 of the first semiconductor die 102 and/or the first end 122 of the electrical interposer 118.

After performing the first molding process, a planarization step is performed. This can be done according to known planarization techniques such a polishing or grinding. The planarization step removes excess molding material and provides a substantially planar surface at the upper side of the assembly. Moreover, the planarization step exposes the terminals of the first semiconductor die 102 and the first planar conductive surface 120 of the electrical interposer 118 from the mold material 150. As shown in FIGS. 2 and 3, the first semiconductor die 102 includes conductive pillars 152, which extend from the upper side 106 of the first semiconductor die 102 and provide the terminals (e.g., the first and second terminals 112, 114) of the first semiconductor die 102. These pillars 152 can easily be planarized and exposed during the planarization process, while keeping a margin between the upper side 106 of the first semiconductor die 102 and the planarization mechanism.

Referring to FIG. 4, after the molding and planarization steps of FIG. 3 are performed, the second semiconductor die 104 is mounted on top of the first semiconductor die 102 and on top of the electrical interposer 118. In this embodiment, the second semiconductor die 104 is larger than the enclosed loop formed by the electrical interposer 118 and hence larger than the first semiconductor die 102. As a result, the second semiconductor die 104 completely covers the first semiconductor die 102 and laterally extends past the outer edge side 110 of the first semiconductor die 102 in all directions. Moreover, the second semiconductor die 104 reaches the electrical interposer 118 in all directions such that the enclosed loop is completely underneath the second semiconductor die 104.

Mounting the second semiconductor die 104 includes electrically connecting the terminals on the lower side 108 of the second semiconductor die 104 to the first conductive surfaces of the electrical interposer 118, e.g., as described with reference to FIG. 1. This may be done, e.g., using a conductive adhesive such as solder or sinter.

After forming the electrical connections, a second molding process is performed to encapsulate the second semiconductor die 104. As a result, the second mold body 138 is formed. This can be done using known molding techniques, such as injection molding, transfer molding, etc. Optionally, before performing the second molding process, the underfill 140 can be formed at the intersection of the first and second mold bodies. This can be done using known techniques.

After completing the second molding process and the underfill process, a dicing (e.g., sawing) process is performed to cut the mold compound between adjacent assemblies. As a result, a plurality of individual semiconductor die assemblies 100 as shown in FIGS. 4B and 4C are provided. Before or after singulation, the solder balls 145 may be formed on the lower side 108 of the semiconductor die assembly as shown in FIG. 4C.

Figure 5:
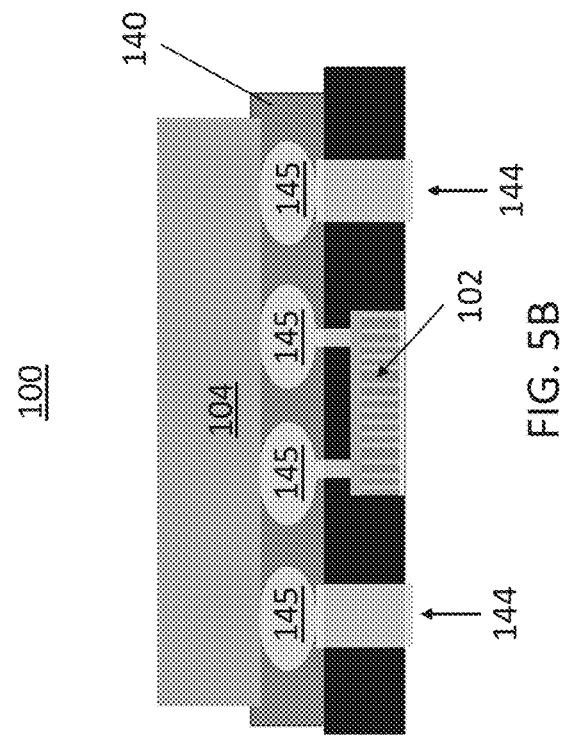
FIG. 5, which includes
Figure 5:
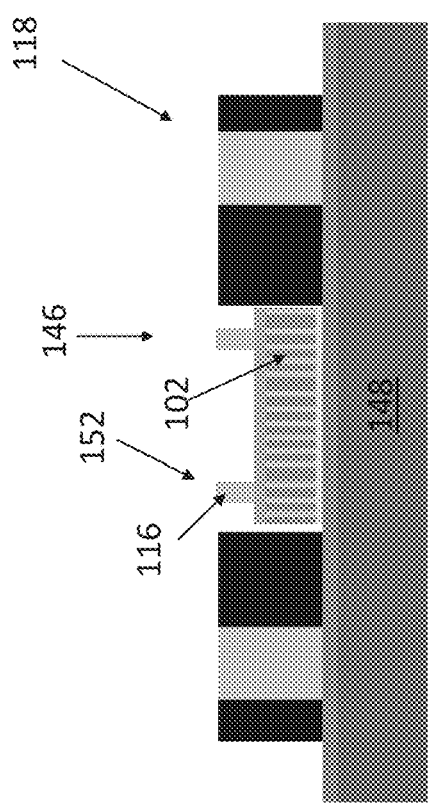

Referring to FIG. 5, an electrical interposer 118 is depicted, according to another embodiment. In this embodiment, the electrical interposer 118 is configured as a molded interconnect substrate (MIS). The molded interconnect substrate forms an enclosed loop around a central opening 146 in a similar geometry as the electrical interposer 118 shown in FIG. 2. The molded interconnect substrate includes a number of molded plastic layers (e.g., epoxy) and one or more metallization layers arranged on more molded plastic layers. Conductive traces are formed in the one or more metallization layers. These conductive traces can form part of the conductive connection 123. The conductive connection 123 can also include via structures extending through the molded plastic layers.

As shown in FIG. 5A, after the molded interconnect substrate is provided, it is placed on a temporary carrier 148. An adhesive tape may be provided on the temporary carrier 148 to provide an adhesive bond between the two. Subsequently, the first semiconductor die 102 is placed in the central opening 146. Subsequently, a molding process is performed to fill the central opening 146 and cover conductive pillars 152 with the molding compound. Subsequently, the temporary carrier 148 is removed. A planarization step is performed which forms a planar upper surface of the mold compound which exposes conductive pillars 152, e.g., in a similar manner as described with reference to FIG. 3A.

As shown in FIG. 5B, the second semiconductor die 104 is attached and electrically connected to terminals of the first semiconductor die 102 and to the electrical interposer 118. In this example, a flip-chip technique is used wherein conductive bumps 145 (e.g., Sn bumps) are provided on the second semiconductor die 104. Optionally, an underfill 140 may be provided at the corner interface in a similar manner as previously provided. Optionally, a second mold body 138 (not shown in FIG. 5) can be provided in a similar manner as previously described.

One advantage of the molded interconnect substrate is that it is well suited for typical planarization techniques, such as polishing and grinding. In particular, the molded interconnect substrate (e.g. molded plastic) is better suited for grinding in comparison to other materials, such as glass fiber substrates. More generally, the concept of FIG. 5 can be implemented using any multi-layer substrate.

Figure 6:
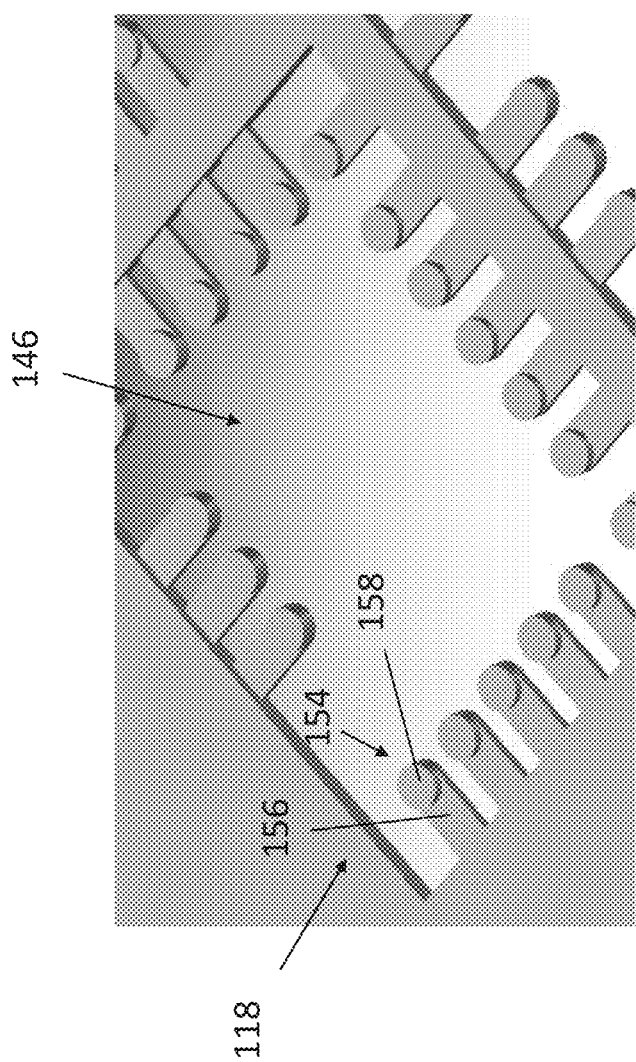
FIG. 6 depicts an alternate embodiment of an electrical interposer that can be used according to the method of FIGS. 2-4.

Referring to FIG. 6, an electrical interposer 118 is depicted, according to another embodiment. According to this technique, the electrical interposer 118 is provided from a planar sheet of conductive sheet metal, e.g., copper. The thickness of the planar sheet can be about the same (e.g., +/−5%) as the thickness of the first semiconductor die 102 as measured between the upper and lower sides 106, 108.

The planar sheet is structured to include the central opening 146 and one or more protrusions 154 extending into the central opening 146. This structuring can be done using known techniques, such as etching, stamping, punching, etc. After forming the central openings 146 and the protrusions 154, the thickness of the protrusions 154 can be locally reduced at a location that is between the edge sides of the central opening 146 and end portions of the protrusions 154. As a result, recessed surfaces 156 are formed between the edge sides of the central opening and end portions of the protrusions 154. The end portions of the protrusions 154 include vertical posts 158 that retain the original thickness of the sheet metal. These vertical posts 158 provide one of the first and second planar surfaces 120, 124, of the electrical interposer 118, with the opposite facing flat side of the sheet metal providing the other one of the first and second planar surface. According to an embodiment, the recessed surfaces 156 are formed by performing an etching process whereby the central portions of the protrusions 154 are selectively exposed to an etchant chemical.

Referring to FIG. 7, the structured sheet metal as described with reference to FIG. 6 is placed on a temporary carrier 148, which may be similar or identical to the temporary carrier 148 described with reference to FIG. 2. In this embodiment, the structured sheet metal is arranged with the recessed surfaces 156 facing downward towards the temporary carrier 148. The first semiconductor die 102 is placed within the central opening 146 such that the lower side 108 of the first semiconductor die 102 faces and rests upon the temporary carrier 148. Subsequently, a first molding process that is similar or identical to the first molding process as previously described is performed such that the central opening 146 is filled with the electrically insulating mold material 150. Subsequently, a planarization process that is similar or identical to the planarization process previously described is performed to expose the terminals of the first semiconductor die 102 and the flat surface of the protrusions 154. As a result, the assembly as shown in FIG. 7B is provided, with the terminals of the first semiconductor die 102 and the first conductive surfaces of the electrical interposer 118 being electrically accessible. As can be seen, the flat surface of the protrusions 154 is exposed from the mold compound 150 and provides the first planar conductive surface 102 of the electrical interposer 118. At the opposite side of the mold compound 150 (not shown) the vertical posts 158 form isolated bond pads which are electrically accessible as the I/O terminals 144. Subsequently, the second semiconductor die 104 can be mounted on top of the first semiconductor die 102 and the electrical connection, second molding process, underfill and singulation steps as previously described can be performed. As a result, a semiconductor chip assembly 100 is provided.

Figure 8:
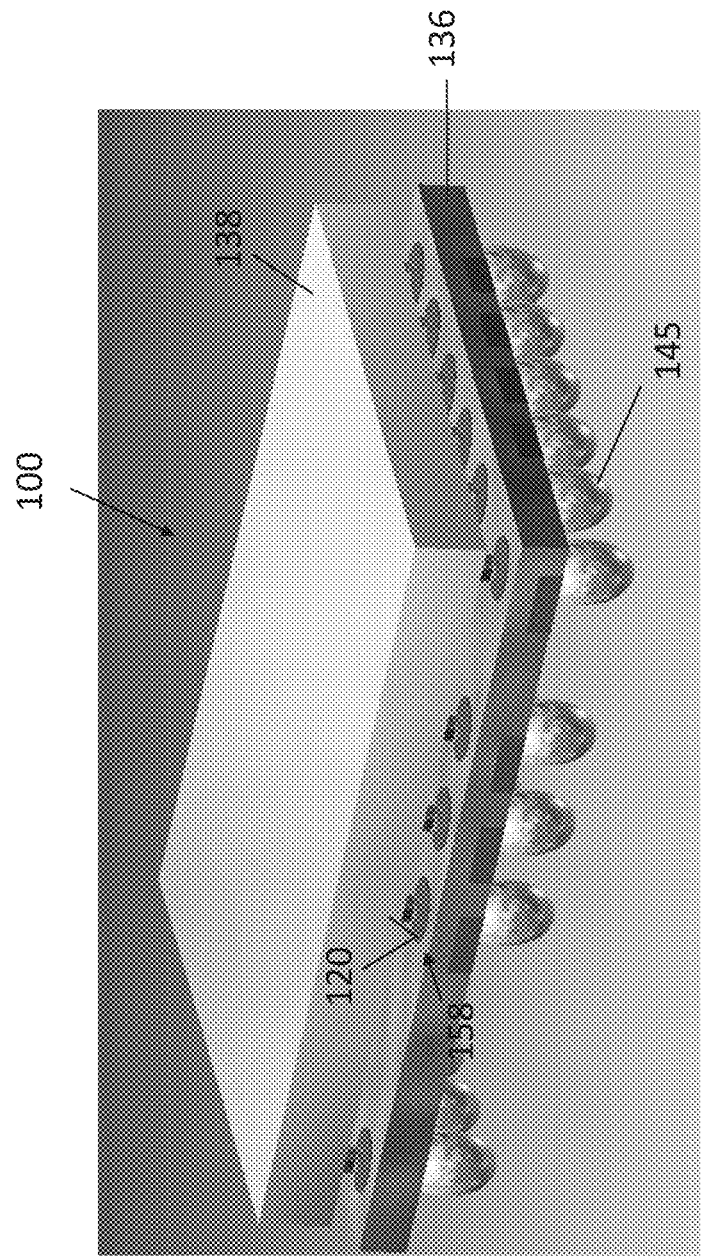
FIG. 8 depicts a semiconductor chip assembly that is formed using the electrical interposer of the FIG. 6, according to an embodiment.

Referring to FIG. 8, a semiconductor chip assembly 100 is depicted, according to an embodiment. This semiconductor chip assembly 100 has been formed according to the same technique as described with reference to FIG. 7, except that the sheet metal is mounted on the temporary carrier 148 with the recessed surface 156 facing away from the temporary carrier 148. As a result, the vertical posts 158 form isolated bond pads in the first mold body 136 which provide the first conductive surface 120 of the electrical interposer 118. At the opposite side of the first mold body 136, the flat surface of the protrusions 154 is exposed from the mold compound and provides the second planar conductive surface 124 of the electrical interposer 118. This arrangement allows for easy soldering to the exposed round bond pads (i.e., the vertical posts 158) to the terminals of the first semiconductor die 102. At the bottom side of the semiconductor chip assembly 100, large surface area connection surfaces are provided for the planar connection interface 142.

In an embodiment of a semiconductor chip assembly that can be combined with others, the semiconductor chip assembly includes first and second semiconductor dies, the first and second semiconductor dies each comprising opposite facing upper and lower sides and an outer edge side extending between the respective upper and lower sides of the first and second semiconductor dies, and an electrical interposer comprising a first conductive surface disposed at a first end, a second conductive surface disposed at a second end that is opposite from the first end, and a conductive connection between the first and second conductive surfaces, wherein the second semiconductor die is mounted on top of the first semiconductor die and the interposer such that: the lower side of the second semiconductor die faces the upper side of the first semiconductor die and the first end of the interposer, a first lateral section of the second semiconductor die at least partially covers the upper side of the first semiconductor die, and a second lateral section of the second semiconductor die extends past the outer edge side of the first semiconductor die and over the first end of the interposer, wherein the first conductive surface is electrically connected to a first terminal of the second semiconductor die that is disposed on the lower side of the second semiconductor die.

In an embodiment of a semiconductor chip assembly that can be combined with others, the semiconductor chip assembly includes, the first semiconductor die comprises a third terminal having a conductive surface that is disposed at or above the upper side of the first semiconductor die, and the first conductive surface of the interposer is substantially coplanar with the conductive surface of the third terminal.

In an embodiment of a semiconductor chip assembly that can be combined with others, the conductive surface of the third terminal is disposed above the upper side of the first semiconductor die, and wherein the first conductive surface protrudes away from an insulating surface of the first end of the electrical interposer In an embodiment of a semiconductor chip assembly that can be combined with others, the electrical interposer forms an enclosed loop around a central opening, and the first semiconductor die is disposed within the central opening.

In an embodiment of a semiconductor chip assembly that can be combined with others, the second semiconductor die completely covers the first semiconductor die and laterally extends past the outer edge side of the first semiconductor in all directions such that the enclosed loop is underneath the second semiconductor die.

In an embodiment of a semiconductor chip assembly that can be combined with others, the interposer comprises an insulative body comprising electrically insulating sidewalls that extend between the first and second ends of the interposer, and the conductive connection is provided by an electrical conductor that is contained within the insulative body.

In an embodiment of a semiconductor chip assembly that can be combined with others, the interposer is formed from a printed circuit board substrate, and wherein the conductive connection comprises a conductive via that extends through one or more layers of the printed circuit board substrate.

In an embodiment of a semiconductor chip assembly that can be combined with others, the interposer is formed from a molded interconnect substrate comprising one or more molded plastic layers and one or more metallization layers arranged on the one or more molded plastic layers, and the conductive connection comprises a conductive trace formed in the one or more metallization layers.

In an embodiment of a semiconductor chip assembly that can be combined with others, the interposer comprises: a planar sheet of conductive sheet metal, one or more protrusions extending from edge sides of the central opening, vertical posts located at ends of the one or more protrusions, and recessed surfaces in the one or more protrusions between edge sides of the central opening and the vertical posts.

In an embodiment of a semiconductor chip assembly that can be combined with others, the recessed surfaces face away from the lower side of the second semiconductor die and the first conductive surface is provided by a flat surface of the one or more protrusions that is opposite from one of the recessed surfaces.

In an embodiment of a semiconductor chip assembly that can be combined with others, the recessed surfaces face towards the lower side of the second semiconductor die and the first conductive surface is provided by a surface of the vertical post that is immediately adjacent to one of the recessed surfaces.

In an embodiment of a semiconductor chip assembly that can be combined with others, the semiconductor chip assembly includes an amplifier die comprising opposite facing upper and lower sides, and an input terminal disposed on the upper side of the amplifier die, a controller die comprising opposite facing upper and lower sides, an input terminal and an output terminal disposed on the lower side of the controller die, an electrical interposer comprising a first conductive surface disposed at a first end, a second conductive surface disposed at a second end that is opposite from the first end, and a conductive connection between the first and second conductive surfaces, a planar connection interface disposed at or below the lower side of the first semiconductor die, the planar connection interface comprising a plurality of conductive I/O terminals, wherein the controller die is mounted on top of the amplifier die such that a first lateral portion of the controller die comprising the output terminal of the controller die is aligned with and electrically connected to the input terminal of the amplifier die, and a second lateral portion of the controller die comprising the input terminal of the controller die is aligned with and electrically connected to the first conductive surface of the interposer, and wherein the electrical interposer provides an electrical connection between a first one of the I/O terminals and the input terminal of the controller die.

In an embodiment of a semiconductor chip assembly that can be combined with others, the semiconductor chip assembly further comprises an electrically insulating mold compound body that encapsulates the controller die and the interposer, the lower side of the first semiconductor die and the second conductive surface are exposed at a bottom side of the mold compound body, and the first I/O terminal is provided by the second conductive surface.

In an embodiment of a method of providing a semiconductor chip assembly that can be combined with others, the method includes providing first and second semiconductor dies, the first and second semiconductor dies each comprising opposite facing upper and lower sides and an outer edge side extending between the respective upper and lower sides of the first and second semiconductor dies, providing an electrical interposer comprising a first conductive surface disposed at a first end, a second conductive surface disposed at a second end that is opposite from the first end, and a conductive connection between the first and second conductive surfaces, and mounting the second semiconductor die on top of the first semiconductor die and the interposer such that: the lower side of the second semiconductor die faces the upper side of the first semiconductor die and the first end of the interposer; a first lateral section of the second semiconductor die at least partially covers the upper side of the first semiconductor die; and a second lateral section of the second semiconductor die extends past the outer edge side of the first semiconductor die and over the first end of the interposer, and electrically connecting the first conductive surface to a first conductive terminal that is disposed on the lower side of the second semiconductor die.

In an embodiment of a method of providing a semiconductor chip assembly that can be combined with others, the first semiconductor die comprises a third terminal having a conductive surface that is disposed above the upper side of the first semiconductor die, the first conductive surface protrudes away from an insulating surface of the first end of the electrical interposer, and mounting the second semiconductor die on top of the first semiconductor die and the interposer comprises arranging the first conductive surface of the interposer to be substantially coplanar with the conductive surface of the third terminal.

In an embodiment of a method of providing a semiconductor chip assembly that can be combined with others, mounting the second semiconductor die on top of the first semiconductor die and the interposer comprises: placing the first semiconductor die and the interposer on a temporary carrier such that the lower side of the semiconductor die and the second end of the interposer directly face and rest on the temporary carrier, performing a first molding process that encapsulates the first semiconductor die and the interposer with an electrically insulating mold compound, and performing a planarization process that exposes the first conductive surface of the interposer and the conductive surface of the third terminal from the mold compound.

In an embodiment of a method of providing a semiconductor chip assembly that can be combined with others, the electrical interposer forms an enclosed loop around a central opening, and arranging the first semiconductor die and the interposer comprises placing the first semiconductor die within the central opening such that the outer edge side is spaced apart from the enclosed loop in all directions, and performing a first molding process comprises filling the central opening with an electrically insulating mold compound.

In an embodiment of a method of providing a semiconductor chip assembly that can be combined with others, providing the electrical interposer comprises: providing a planar sheet of conductive sheet metal, structuring the planar sheet to include the central opening and one or more protrusions extending from edge sides of the enclosed loop, reducing a thickness of the one or more protrusions between the edge sides of the enclosed loop and end portions of the protrusions thereby forming recessed surfaces between the edge sides of the enclosed loop and vertical posts at the end portions of the protrusions.

In an embodiment of a method of providing a semiconductor chip assembly that can be combined with others, arranging the first semiconductor die and the interposer comprises placing the electrical interposer on the temporary carrier such that the recessed surface faces the temporary carrier.

In an embodiment of a method of providing a semiconductor chip assembly that can be combined with others, arranging the first semiconductor die and the interposer comprises placing the electrical interposer on the temporary carrier such that the recessed surface faces away from the temporary carrier.

The term "electrically connected" "directly electrically connected" and the like describes a permanent low-ohmic, i.e., low-resistance, connection between electrically connected elements, for example a wire connection, between the concerned elements. By contrast, the term "electrically coupled" describes a connection with a non-negligible impedance (ether resistive or reactive) between the concerned elements. For instance, active elements, such as transistors, as well as passive elements, such as inductors, capacitors, diodes, resistors, etc., may electrically couple two elements together.

The term "substantially" encompasses absolute conformity with a requirement as well as minor deviation from absolute conformity with the requirement due to manufacturing process variations, assembly, and other factors that may cause a deviation from the desired parameter. Provided that the deviation is within process tolerances so as to achieve practical conformity and the components described herein are able to function according to the application requirements, the term "substantially" encompasses any of these deviations.

Terms such as "same," "match," and "matches" as used herein are intended to mean identical, nearly identical or approximately so that some reasonable amount of variation is contemplated without departing from the spirit of the invention. Further, terms such as "first," "second," and the like are used to describe various elements, regions, sections, etc., and are also not intended to be limiting. Like terms refer to like elements throughout the description.

Spatially relative terms such as "under," "below," "lower," "over," "upper," and the like are used for ease of description to explain the positioning of one element relative to a second element. These terms are intended to encompass different orientations of the device in addition to different orientations than those depicted in the figures.

As used herein, the terms "having," "containing," "including," "comprising," and the like are open ended terms that indicate the presence of stated elements or features, but do not preclude additional elements or features. The articles "a," "an," and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor chip assembly, comprising:
    first and second semiconductor dies, the first and second semiconductor dies each comprising opposite facing upper and lower sides and an outer edge side extending between the respective upper and lower sides of the first and second semiconductor dies; and
    an electrical interposer comprising a first conductive surface disposed at a first end, a second conductive surface disposed at a second end that is opposite from the first end, and a conductive connection between the first and second conductive surfaces;
    wherein the second semiconductor die is mounted on top of the first semiconductor die and the interposer such that:
        the lower side of the second semiconductor die faces the upper side of the first semiconductor die and the first end of the interposer;
        a first lateral section of the second semiconductor die at least partially covers the upper side of the first semiconductor die; and
        a second lateral section of the second semiconductor die extends past the outer edge side of the first semiconductor die and over the first end of the interposer,
    wherein the first conductive surface is electrically connected to a first terminal of the second semiconductor die that is disposed on the lower side of the second semiconductor die.

2. The semiconductor chip assembly of claim 1, wherein the first semiconductor die comprises a third terminal having a conductive surface that is disposed at or above the upper side of the first semiconductor die, and wherein the first conductive surface of the interposer is substantially coplanar with the conductive surface of the third terminal.

3. The semiconductor chip assembly of claim 2, wherein the conductive surface of the third terminal is disposed above the upper side of the first semiconductor die, and wherein the first conductive surface protrudes away from an insulating surface of the first end of the electrical interposer.

4. The semiconductor chip assembly of claim 2, wherein the electrical interposer forms an enclosed loop around a central opening, and wherein the first semiconductor die is disposed within the central opening.

5. The semiconductor chip assembly of claim 4, wherein the second semiconductor die completely covers the first semiconductor die and laterally extends past the outer edge side of the first semiconductor in all directions, and wherein the enclosed loop is at least partially underneath the second semiconductor die.

6. The semiconductor chip assembly of claim 5, wherein the interposer comprises an insulative body comprising electrically insulating sidewalls that extend between the first and second ends of the interposer, and wherein the conductive connection is provided by an electrical conductor that is contained within the insulative body.

7. The semiconductor chip assembly of claim 6, wherein the interposer is formed from a printed circuit board substrate, and wherein the conductive connection comprises a conductive via that extends through one or more layers of the printed circuit board substrate.

8. The semiconductor chip assembly of claim 6, wherein the interposer is formed from a molded interconnect substrate comprising one or more molded plastic layers and one or more metallization layers arranged on the one or more molded plastic layers, and wherein the conductive connection comprises a conductive trace formed in the one or more metallization layers.

9. The semiconductor chip assembly of claim 4, wherein the interposer comprises:
    a planar sheet of conductive sheet metal;
    one or more protrusions extending from edge sides of the central opening;
    vertical posts located at ends of the one or more protrusions; and
    recessed surfaces in the one or more protrusions between edge sides of the central opening and the vertical posts.

10. The semiconductor chip assembly of claim 9, wherein the recessed surfaces face away from the lower side of the second semiconductor die and the first conductive surface is provided by a flat surface of the one or more protrusions that is opposite from one of the recessed surfaces.

11. The semiconductor chip assembly of claim 9, wherein the recessed surfaces face towards the lower side of the second semiconductor die and the first conductive surface is provided by a surface of the vertical post that is immediately adjacent to one of the recessed surfaces.

12. A semiconductor chip assembly, comprising:
    an amplifier die comprising opposite facing upper and lower sides, and an input terminal disposed on the upper side of the amplifier die,
    a controller die comprising opposite facing upper and lower sides, an input terminal and an output terminal disposed on the lower side of the controller die;
    an electrical interposer comprising a first conductive surface disposed at a first end, a second conductive surface disposed at a second end that is opposite from the first end, and a conductive connection between the first and second conductive surfaces; and
    a planar connection interface disposed at or below the lower side of the first semiconductor die, the planar connection interface comprising a plurality of conductive I/O terminals,
    wherein the controller die is mounted on top of the amplifier die such that a first lateral portion of the controller die comprising the output terminal of the controller die is aligned with and electrically connected to the input terminal of the amplifier die, and a second lateral portion of the controller die comprising the input terminal of the controller die is aligned with and electrically connected to the first conductive surface of the interposer, and
    wherein the electrical interposer provides an electrical connection between a first one of the I/O terminals and the input terminal of the controller die.

13. The semiconductor chip assembly of claim 12, wherein the semiconductor chip assembly further comprises an electrically insulating mold compound body that encapsulates the controller die and the interposer, wherein the lower side of the first semiconductor die and the second conductive surface are exposed at a bottom side of the mold compound body, and wherein the first I/O terminal is provided by the second conductive surface.

14. A method of providing a semiconductor chip assembly, the method comprising:
providing first and second semiconductor dies, the first and second semiconductor dies each comprising opposite facing upper and lower sides and an outer edge side extending between the respective upper and lower sides of the first and second semiconductor dies;
providing an electrical interposer comprising a first conductive surface disposed at a first end, a second conductive surface disposed at a second end that is opposite from the first end, and a conductive connection between the first and second conductive surfaces; and
mounting the second semiconductor die on top of the first semiconductor die and the interposer such that:
the lower side of the second semiconductor die faces the upper side of the first semiconductor die and the first end of the interposer;
a first lateral section of the second semiconductor die at least partially covers the upper side of the first semiconductor die; and
a second lateral section of the second semiconductor die extends past the outer edge side of the first semiconductor die and over the first end of the interposer, and
electrically connecting the first conductive surface to a first conductive terminal that is disposed on the lower side of the second semiconductor die.

15. The method of claim 14, wherein the first semiconductor die comprises a third terminal having a conductive surface that is disposed above the upper side of the first semiconductor die, wherein the first conductive surface protrudes away from an insulating surface of the first end of the electrical interposer, and wherein mounting the second semiconductor die on top of the first semiconductor die and the interposer comprises arranging the first conductive surface of the interposer to be substantially coplanar with the conductive surface of the third terminal.

16. The method of claim 15, wherein mounting the second semiconductor die on top of the first semiconductor die and the interposer comprises:

placing the first semiconductor die and the interposer on a temporary carrier such that the lower side of the semiconductor die and the second end of the interposer directly face and rest on the temporary carrier;
performing a first molding process that encapsulates the first semiconductor die and the interposer with an electrically insulating mold compound; and
performing a planarization process that exposes the first conductive surface of the interposer and the conductive surface of the third terminal from the mold compound.

17. The method of claim 16, wherein the electrical interposer forms an enclosed loop around a central opening, and wherein arranging the first semiconductor die and the interposer comprises placing the first semiconductor die within the central opening such that the outer edge side is spaced apart from the enclosed loop in all directions, and wherein performing a first molding process comprises filling the central opening with an electrically insulating mold compound.

18. The method of claim 17, wherein providing the electrical interposer comprises:
providing a planar sheet of conductive sheet metal;
structuring the planar sheet to include the central opening and one or more protrusions extending from edge sides of the enclosed loop; and
reducing a thickness of the one or more protrusions between the edge sides of the enclosed loop and end portions of the protrusions thereby forming recessed surfaces between the edge sides of the enclosed loop and vertical posts at the end portions of the protrusions.

19. The method of claim 18, wherein arranging the first semiconductor die and the interposer comprises placing the electrical interposer on the temporary carrier such that the recessed surface faces the temporary carrier.

20. The method of claim 18, wherein arranging the first semiconductor die and the interposer comprises placing the electrical interposer on the temporary carrier such that the recessed surface faces away from the temporary carrier.

* * * * *

UNITED STATES PATENT AND TRADEMARK OFFICE
CERTIFICATE OF CORRECTION

PATENT NO. : 10,629,575 B1
APPLICATION NO. : 16/219277
DATED : April 21, 2020
INVENTOR(S) : T. Scharf et al.

It is certified that error appears in the above-identified patent and that said Letters Patent is hereby corrected as shown below:

On the Title Page

Item (73) Assignee, please change "Infineon Techologies" to -- Infineon Technologies --

Signed and Sealed this
Twenty-third Day of June, 2020

Andrei Iancu
*Director of the United States Patent and Trademark Office*